(12) United States Patent
Afzali-Ardakani et al.

(10) Patent No.: US 8,445,316 B2
(45) Date of Patent: May 21, 2013

(54) NON-LITHOGRAPHIC METHOD OF PATTERNING CONTACTS FOR A PHOTOVOLTAIC DEVICE

(75) Inventors: Ali Afzali-Ardakani, Ossining, NY (US); Jeffrey C. Hedrick, Montvale, NJ (US); Mahmoud Khojasteh, Poughkeepsie, NY (US); Young-Hee Kim, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/162,712

(22) Filed: Jun. 17, 2011

(65) Prior Publication Data

US 2012/0322200 A1    Dec. 20, 2012

(51) Int. Cl.
*H01L 21/00* (2006.01)
*H01L 31/0224* (2006.01)

(52) U.S. Cl.
USPC .................................. 438/98; 257/E31.124

(58) Field of Classification Search
USPC ......... 438/68, 84, 98; 257/E21.599, E31.027, 257/E31.124
See application file for complete search history.

(56) References Cited

U.S. PATENT DOCUMENTS

| | | | | |
|---|---|---|---|---|
| 4,935,800 A * | 6/1990 | Taguchi | ........................ | 257/520 |
| 5,146,303 A * | 9/1992 | Kornrumpf et al. | .......... | 257/459 |
| 6,621,096 B2 * | 9/2003 | Lee et al. | ........................ | 257/10 |
| 2002/0153039 A1 * | 10/2002 | Moon et al. | .................... | 136/256 |
| 2003/0122150 A1 * | 7/2003 | Chen | ............................. | 257/118 |
| 2004/0141425 A1 * | 7/2004 | Fujita et al. | ................ | 369/13.06 |
| 2004/0161931 A1 * | 8/2004 | Parthasarathy et al. | ........ | 438/689 |
| 2005/0182149 A1 * | 8/2005 | Crivello | ............................ | 522/4 |
| 2008/0132428 A1 * | 6/2008 | Cox et al. | ........................ | 506/26 |
| 2009/0117360 A1 * | 5/2009 | Clevenger et al. | ............ | 428/220 |
| 2011/0117695 A1 * | 5/2011 | Cheng et al. | .................... | 438/99 |
| 2011/0318863 A1 * | 12/2011 | Tu et al. | .......................... | 438/68 |

* cited by examiner

*Primary Examiner* — Charles Garber
*Assistant Examiner* — Calvin Choi
(74) *Attorney, Agent, or Firm* — Scully, Scott, Murphy & Presser, P.C.; Louis J. Percello, Esq.

(57) ABSTRACT

A dielectric material layer is formed on a front surface of a photovoltaic device. A patterned PMMA-type-material-including layer is formed on the dielectric material layer, and the pattern is transferred into the top portion of the photovoltaic device to form trenches in which contact structures can be formed. In one embodiment, a blanket PMMA-type-material-including layer is deposited on the dielectric material layer, and is patterned by laser ablation that removes ablated portions of PMMA-type-material. The PMMA-type-material-including layer may also include a dye to enhance absorption of the laser beam. In another embodiment, a blanket PMMA-type-material-including layer may be deposited on the dielectric material layer and mechanically patterned to form channels therein. In yet another embodiment, a patterned PMMA-type-material-including layer is stamped on top of the dielectric material layer.

25 Claims, 12 Drawing Sheets

NON-LITHOGRAPHIC METHOD OF PATTERNING CONTACTS FOR A PHOTOVOLTAIC DEVICE

BACKGROUND

The present disclosure generally relates to methods of forming contacts to a photovoltaic device, and particularly to non-lithographic methods of forming contacts to a front surface of a photovoltaic device on which light impinges.

Many photovoltaic devices employ a semiconductor p-n junction to induce spatial asymmetry by which electron-hole pairs generated by photons are directed in different directions. Typically, one type of semiconductor material is present on one side of a photovoltaic device, and the opposite type of semiconductor material is present on the other side of the photovoltaic device. The p-type material can be present on the front side and the n-type material can be present on the back side, or vice versa.

Light that impinges onto a front surface of a photovoltaic device passes through the front surface and generates an electron-hole pair within the semiconductor material. An electrostatic field generated by the p-n junction causes the electrons generated by the light to move toward the n-type material, and the holes generated by the light to move toward the p-type material. Contacts are made to the front side and the back side of the photovoltaic device to collect the charge carriers, thereby providing electromotive force for the photovoltaic device.

Contacts to the back surface of a photovoltaic device do not need patterning because light does not need pass through the back surface. Thus, a conductive sheet is typically employed as a back side electrode. Contacts to the front surface of a photovoltaic device need to be made to maximize the transmission of light through the front surface. Thus, contacts to the front surface of a photovoltaic cell are patterned, typically as a conductive grid having a pattern of parallel lines that are tied at one side or at both sides of the grid.

While such a conductive grid can be patterned employing lithographic methods, such processing steps tend to be expensive and time consuming. Thus, inexpensive and fast processing methods for forming contact structures on a front surface of a photovoltaic device are desired.

BRIEF SUMMARY

A dielectric material layer is formed on a front surface of a photovoltaic device. A patterned PMMA-type-material-including layer is formed on the dielectric material layer, and the pattern is transferred into the top portion of the photovoltaic device to form trenches in which contact structures can be formed. In one embodiment, a blanket PMMA-type-material-including layer is deposited on the dielectric material layer, and is patterned by laser ablation that removes ablated portions of PMMA-type-material. The PMMA-type-material-including layer may also include a dye to enhance absorption of the laser beam. In another embodiment, a blanket PMMA-type-material-including layer may be deposited on the dielectric material layer and mechanically patterned to form channels therein. In yet another embodiment, a patterned PMMA-type-material-including layer can be achieved by screen printing, ink jet printing, etc.

According to an aspect of the present disclosure, a method of forming contact structures on a photovoltaic substrate is provided, which includes: forming a dielectric material layer on a photovoltaic substrate; forming a patterned PMMA-type-material-including layer on the dielectric material layer; transferring a pattern in the patterned PMMA-type-material-including layer through the dielectric material layer and into an upper portion of the photovoltaic substrate, wherein trenches having semiconductor surfaces are formed in the upper portion of the photovoltaic substrate; and forming contact structures in the trenches.

In one embodiment, the patterned PMMA-type-material-including layer can be formed by applying a blanket PMMA-type-material-including layer on the dielectric material layer; and ablating portions of the blanket PMMA-type-material-including layer with a laser beam. Remaining portions of the blanket PMMA-type-material-including layer after the ablation is the patterned PMMA-type-material-including layer.

In another embodiment, the patterned PMMA-type-material-including layer can be formed by: applying a blanket PMMA-type-material-including layer on the dielectric material layer; immersing a plurality of protruding portions of a mechanical scribing device into the blanket PMMA-type-material-including layer; and inducing a relative movement between the blanket PMMA-type-material-including layer and the plurality of protruding portions.

In yet another embodiment, the patterned PMMA-type-material-including layer can be formed by screen printing or ink jet printing.

DETAILED DESCRIPTION

Figure 1:
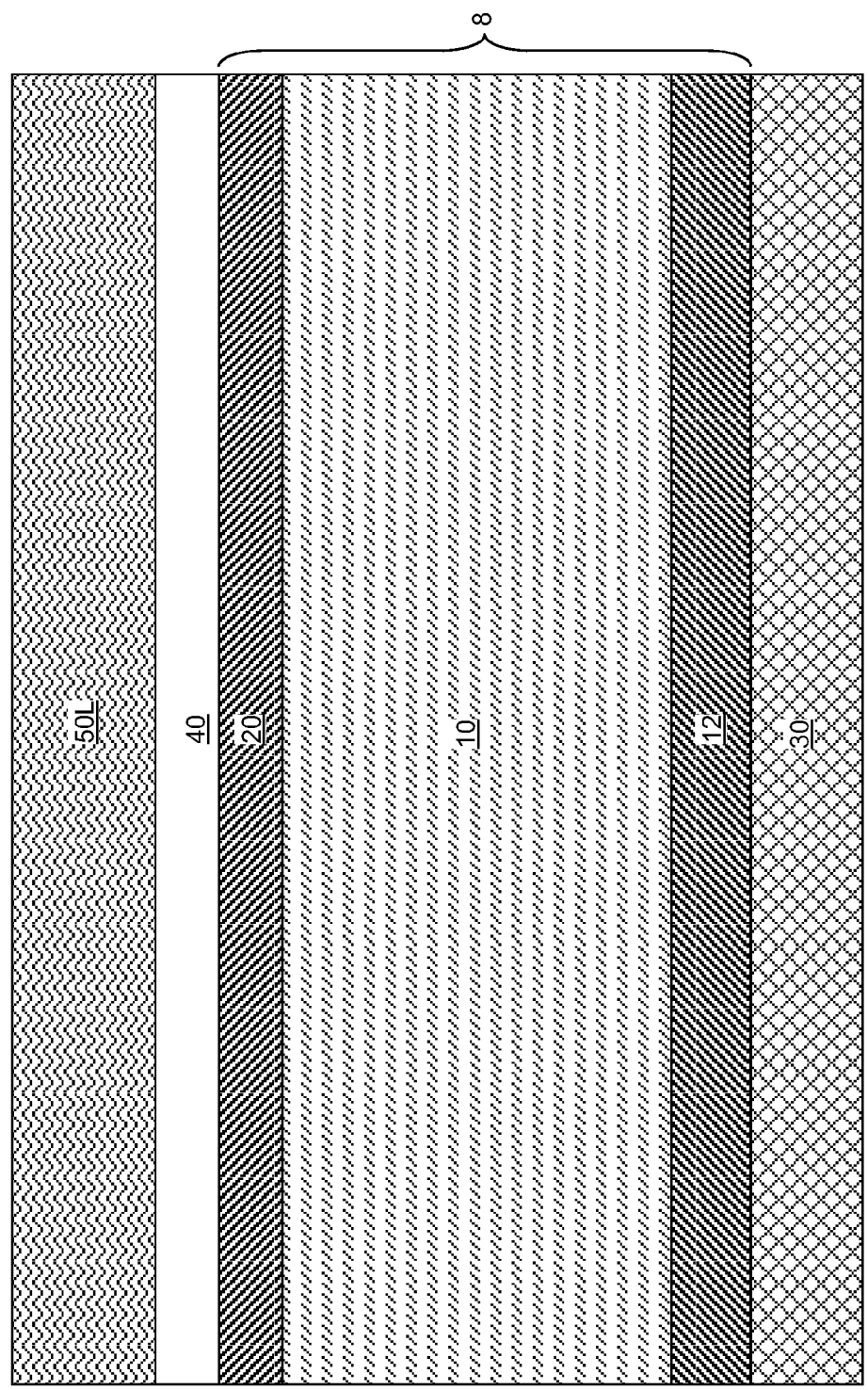
FIG. 1 is a vertical cross-sectional view of a first exemplary semiconductor structure after formation of a blanket PMMA-type-material-including layer according to a first embodiment of the present disclosure.

As stated above, the present disclosure relates to non-lithographic methods of forming contacts to a front surface of a photovoltaic device on which light impinges, which are now described in detail with accompanying figures. It is noted that like reference numerals refer to like elements across different embodiments. The drawings are not necessarily drawn to scale.

As used herein, a "photovoltaic substrate" refers to a substrate including a p-n junction between a p-type semiconductor material and an n-type semiconductor material. A photovoltaic device, which generates electricity by exposure to infrared, visible, and/or ultraviolet radiation, can be manufactured on a photovoltaic substrate by providing electrical contacts to the p-type semiconductor material and electrical contacts to the n-type semiconductor material.

As used herein, a "PMMA-type-material" refers to a class of polymers that includes poly(methyl methacrylate) (i.e., PMMA), polyacrylate, polymethacrylate, polyalkylene substituted with carboxylic ester, polystyrene, cellulosic materials, poly(ethylene terephthalate), bisphenol polycarbonate, polyethylene, polypropylene, polyacetylene, chlorinated polystyrene, poly(dialkylsilane), poly(methylmethacrylate)-co-polydialkylsilane), and poly(N-vinylcarbazole), or any composite form thereof. Non-limiting examples of cellulosic materials include nitrocellulose and butvar. Non-limiting examples of poly(dialkylsilane) include poly(dimethylsilane) and poly(cyclohexylmethylsilane).

As used herein, a "composite form" refers to a derivative form of a material that is derived from an original material by pigmentation with at least one oxide including, but not limited to, silicon oxide, aluminum oxide, and iron oxide. The amount of the at least one oxide in a composite form may be greater than 0 percent in volume concentration and up to 50 percent in volume concentration.

As used herein, a "PMMA-type-material-including" element refers to any element that includes at least one PMMA-type-material.

Referring to FIG. 1, a photovoltaic substrate 8 includes a first conductivity type semiconductor layer 10 and a second conductivity type semiconductor layer 20. The first conductivity type semiconductor layer 10 includes a semiconductor material of a first conductivity type, which can be p-type or n-type. The second conductivity type semiconductor layer 20 includes a semiconductor material of a second conductivity type, which is the opposite type of the first conductivity type. For example, if the first conductivity type is p-type, the second conductivity type is n-type, and vice versa.

The first conductivity type semiconductor layer 10 includes a semiconductor material and dopants of the first conductivity type. The semiconductor material can be silicon, germanium, a silicon germanium alloy, a silicon carbon alloy, a silicon germanium carbon alloy, a III-V compound semiconductor material, a II-VI compound semiconductor material, or any other semiconductor material known in the art. The second conductivity type semiconductor layer 20 includes a semiconductor material and dopants of the second conductivity type. The semiconductor material of the second conductivity type semiconductor layer 20 can be the same as, or different from, the semiconductor material of the first conductivity type semiconductor layer 10. The semiconductor material of the first conductivity type semiconductor layer 10 and the second conductivity type semiconductor layer 20 can be independently single crystalline, polycrystalline, and/or amorphous.

The thickness of the first conductivity type semiconductor layer 10 can be from 0.5 micron to 300 microns, and typically from 1 micron to 30 microns, although lesser and greater thicknesses can also be employed. The thickness of the second conductivity type semiconductor layer 20 can be from 0.1 micron to 10 microns, and typically from 0.2 microns to 2 microns, although lesser and greater thicknesses can also be employed.

P-type dopants can be B, Ga, In, or a combination thereof, and n-type dopants can be P, As, Sb, or a combination thereof. Dopant concentration in the first conductivity type semiconductor layer 10 can be from $1.0 \times 10^{14}/cm^3$ to $1.0 \times 10^{21}/cm^3$, and typically from $1.0 \times 10^{16}/cm^3$ to $1.0 \times 10^{18}/cm^3$, although lesser and greater dopant concentrations can also be employed. Dopant concentration in the second conductivity type semiconductor layer 20 can be from $1.0 \times 10^{17}/cm^3$ to $1.0 \times 10^{21}/cm^3$, and typically from $1.0 \times 10^{18}/cm^3$ to $1.0 \times 10^{20}/cm^3$, although lesser and greater dopant concentrations can also be employed.

A back side semiconductor layer 12 can be optionally provided in the photovoltaic substrate 8. The back side semiconductor layer 12 contacts the back side of the first conductivity type semiconductor layer 10, and has a doping of the first conductivity type, i.e., includes dopants of the first conductivity type. If present, the back side semiconductor layer 12 has a dopant concentration greater than the dopant concentration of the first conductivity type semiconductor layer 10. Dopant concentration in the back side semiconductor layer 20 can be from $1.0 \times 10^{17}/cm^3$ to $1.0 \times 10^{21}/cm^3$, and typically from $1.0 \times 10^{19}/cm^3$ to $5.0 \times 10^{20}/cm^3$, although lesser and greater dopant concentrations can also be employed. The thickness of the back side semiconductor layer 12 can be from 0.2 micron to 30 microns, and typically from 0.4 micron to 3 microns, although lesser and greater thicknesses can also be employed.

One of the first conductivity type semiconductor layer 10 and the second conductivity type semiconductor layer 20 is a p-doped semiconductor material layer including a p-type semiconductor material, and the other of the first conductivity type semiconductor layer 10 and the second conductivity type semiconductor layer 20 is an n-doped semiconductor material layer including an n-type semiconductor material. The photovoltaic substrate 8 includes a p-n junction at an interface between the first conductivity type semiconductor layer 10 and the second conductivity type semiconductor layer 20.

Optionally, a conductive plate 30 can be formed on the back side surface of the photovoltaic substrate 8. The back side surface is the exposed surface of the back side semiconductor layer 12, if present, or the exposed surface of the back side of the first conductivity type layer 10 if a back side semiconductor layer is not present. The conductive plate provides an electrical contact to the semiconductor material on one side of the p-n junction, i.e., the semiconductor material of the first conductivity type semiconductor layer 10 and, if present, the back side semiconductor layer 12.

While a stack of the back side semiconductor layer 12, the first conductivity type semiconductor layer 10, and the second conductivity type semiconductor layer 20 is illustrated herein as a photovoltaic substrate 8, the method of the present disclosure can also be employed for any photovoltaic substrate including a p-n junction therein.

A dielectric material layer 40 is formed on the exposed surface of the second conductivity type semiconductor layer 20. The dielectric material layer 40 contacts the second conductivity type semiconductor layer 20, and is formed on the opposite side of the conductive plate 30. The dielectric material layer 40 includes a dielectric material, which can be silicon dioxide, silicon nitride, silicon oxynitride, aluminum oxide, any other dielectric material that is optically transparent in the infrared, visible, and/or ultraviolet range, and combinations thereof.

The dielectric material layer 40 can be deposited, for example, by chemical vapor deposition (CVD), spin coating and optional baking, or a combination thereof. The thickness of the dielectric material layer 40 can be from 50 nm to 2,000 nm, and typically from 100 nm to 1,000 nm, although lesser and greater thicknesses can also be employed.

A blanket PMMA-type-material-including layer 50L is formed on the top surface of the dielectric material layer 40. The blanket PMMA-type-material-including layer 50L can be deposited, for example, by spin coating. The thickness of the blanket PMMA-type-material-including layer 50L can be from 0.5 micron to 10 microns, and typically from 2 microns to 4 microns, although lesser and greater thicknesses can also be employed. The blanket PMMA-type-material-including layer 50L can be self-planarizing if spin-coated.

In one embodiment, the blanket PMMA-type-material-including layer 50L consists essentially of one or more PMMA-type-material.

In another embodiment, the blanket PMMA-type-material-including layer 50L includes one or more PMMA-type-material and at least one dye that can enhance absorption of light. The blanket PMMA-type-material-including layer 50L may consist essentially of one or more PMMA-type-material and at least one dye. If a dye is included in the blanket PMMA-type-material-including layer 50L, the dye has an absorption wavelength range around at least one wavelength in the infrared, visible, or ultraviolet wavelength range. The dye enhances the absorption of the laser beam to be subsequently employed to ablate portions of the PMMA-type-material-including layer 50L. The dye can be added to at least one PMMA-type-material and mixed to form a solution including the dye and the at least one PMMA-type-material, which is subsequently applied to the top surface of the dielectric material layer 40. After the solvent evaporates, the blanket PMMA-type-material-including layer 50L can be formed.

In general, any dye that can be uniformly mixed with at least one PMMA-type-material without segregation and has at least one absorption wavelength near the wavelength of a laser beam to be subsequently employed for local ablation can be employed for the blanket PMMA-type-material-including layer 50L. In a non-limiting embodiment, the blanket PMMA-type-material-including layer 50L includes PMMA-type-material and a dye selected from pyerenemethanol and Sudan III. The at least one dye can be present in the blanket PMMA-type-material-including layer 50L at a weight percentage between 0.1% to 10%, although lesser and greater weight percentages can also be employed. The balance of the blanket PMMA-type-material-including layer 50L can be the PMMA-type-material material therein, i.e., the blanket PMMA-type-material-including layer 50L can consist essentially of PMMA-type-material and the at least one dye.

Figure 2:
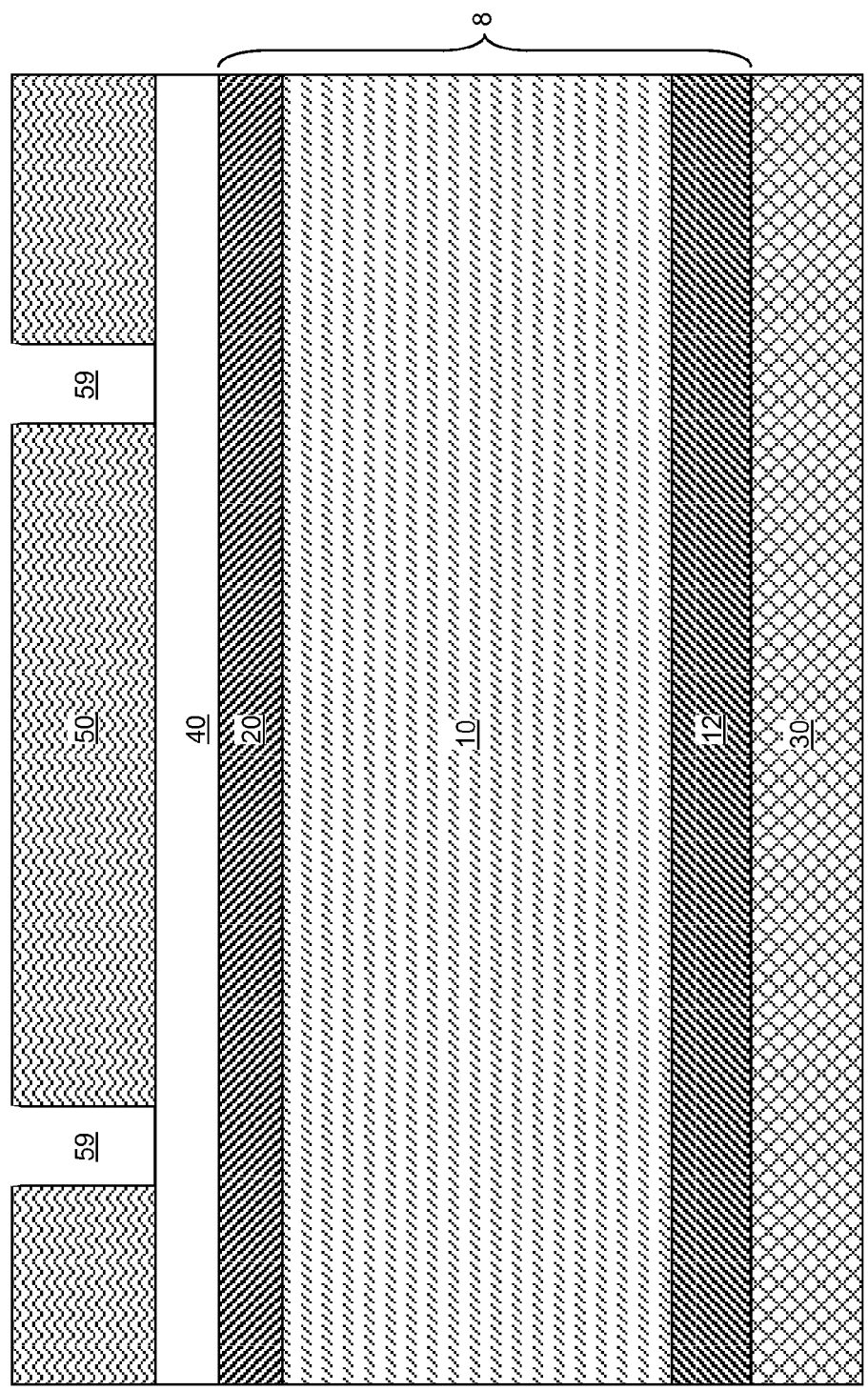
FIG. 2 is a vertical cross-sectional view of the first exemplary semiconductor structure after ablating portions of the blanket PMMA-type-material-including layer for form a patterned PMMA-type-material-including layer according to the first embodiment of the present disclosure.

Referring to FIG. 2, portions of the blanket PMMA-type-material-including layer 50L are ablated by a laser beam. The laser beam impinging on the blanket PMMA-type-material-including layer 50L forms openings 59 in the blanket PMMA-type-material-including layer 50L. The remaining portions of the blanket PMMA-type-material-including layer 50L after the ablation is the patterned PMMA-type-material-including layer 50, which is located on the surface of the dielectric material layer 40.

The laser beam can have a wavelength in the infrared, visible, or ultraviolet range, and typically has a wavelength from 150 nm to 1,200 nm. In one embodiment, the laser beam may have an ultraviolet wavelength less than 400 nm. For example, the laser employed to generate the laser beam may be an excimer laser having a wavelength between 150 nm and 400 nm. In another embodiment, the laser beam may have a visible wavelength between 400 nm and 800 nm. For example, the laser employed to generate the laser beam may be a YAG laser having a wavelength between 400 nm and 800 nm.

The ablation of portions of the blanket PMMA-type-material-including layer 50L exposes a surface of the dielectric material layer 40 underneath each opening 59 within the patterned PMMA-type-material-including layer 50. Multiple openings 59 can be formed in the patterned PMMA-type-material-including layer 50. Further, the multiple openings 59 can be formed to isolate the patterned PMMA-type-material-including layer 50 into multiple PMMA-type-material-including portions that do not contact one another.

The openings 59 within the patterned PMMA-type-material-including layer 50 can be in the form of line trenches that are parallel to one another. The width of each opening 59 within the patterned PMMA-type-material-including layer 50 can be on the order of the size of the laser beam, and is from 0.5 micron to 30 microns, and typically from 1 micron to 10 microns, although lesser and greater widths can also be employed. The laser beam can be continuously applied along the lengthwise direction of the openings 59 so that the openings 59 form line trenches running in a lengthwise direction. The length of such line trenches can be from 10 microns to 1 cm, although lesser and greater lengths can also be employed. The spacing between such line trenches can be from 1 micron to 100 microns, although lesser and greater spacings can also be employed.

Figure 3:
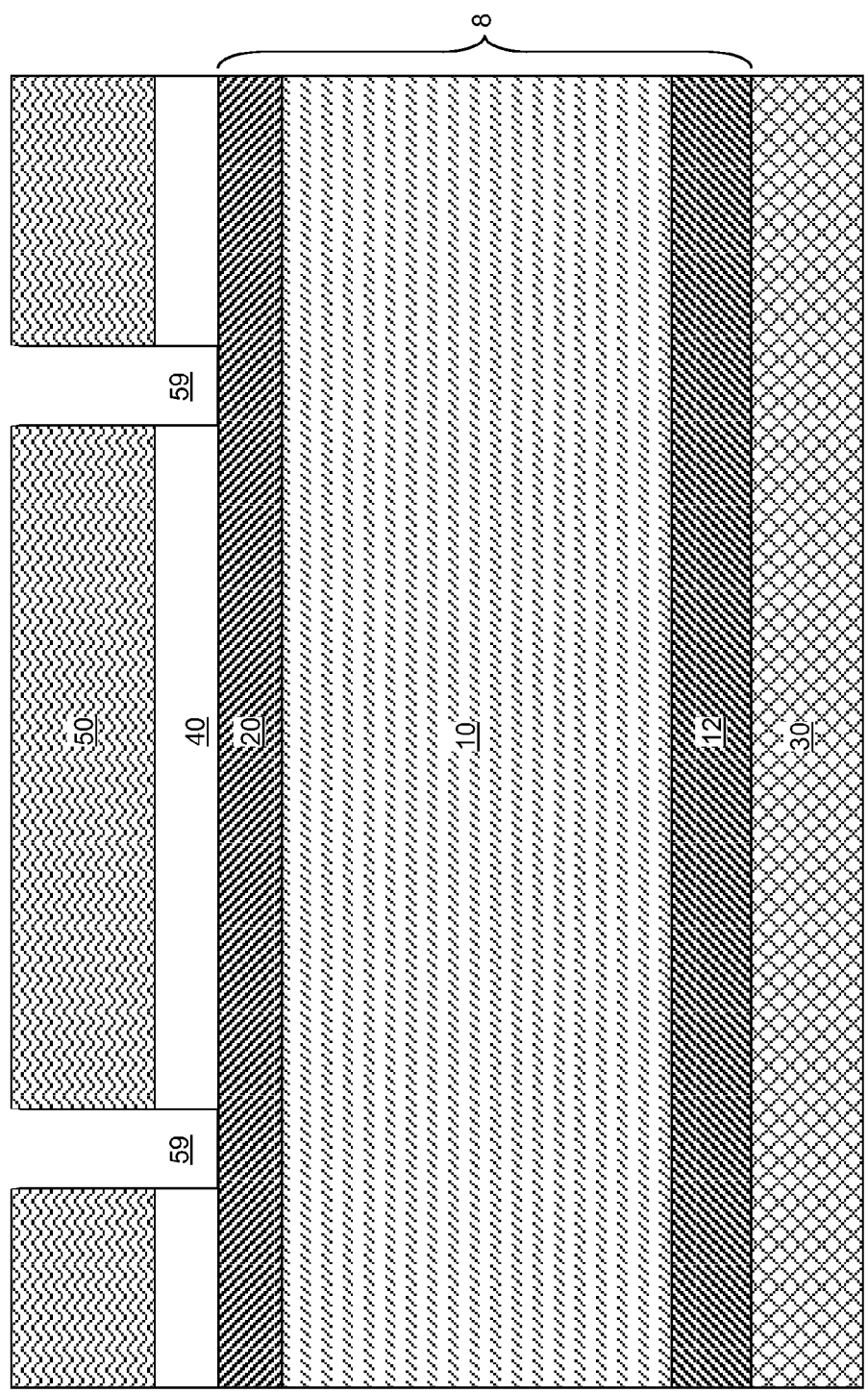
FIG. 3 is a vertical cross-sectional view of the first exemplary semiconductor structure after transferring the pattern in the patterned PMMA-type-material-including layer into a dielectric material layer according to the first embodiment of the present disclosure.

Referring to FIG. 3, the pattern in the patterned PMMA-type-material-including layer 50 is transferred into a dielectric material layer 40 by an etch, which can be a wet etch. For example, a buffered oxide etch (BOE) employing hydrofluoric acid (HF) and ammonium fluoride ($NH_4F$) diluted in water. The ratio of ammonium fluoride to hydrofluoric acid can be about 9:1, and the concentration of the ammonium fluoride and hydrofluoric acid in water can be adjusted as known in the art. The etch time is selected so that the dielectric material layer 40 is etched through to expose surfaces of the second conductivity type semiconductor layer 20. The wet etch can proceed employing the patterned PMMA-type-material-including layer 50 as an etch mask so that the pattern of the openings 59 in the patterned PMMA-type-material-including layer 50 is replicated in the dielectric material layer 40 after the etch.

Figure 4:
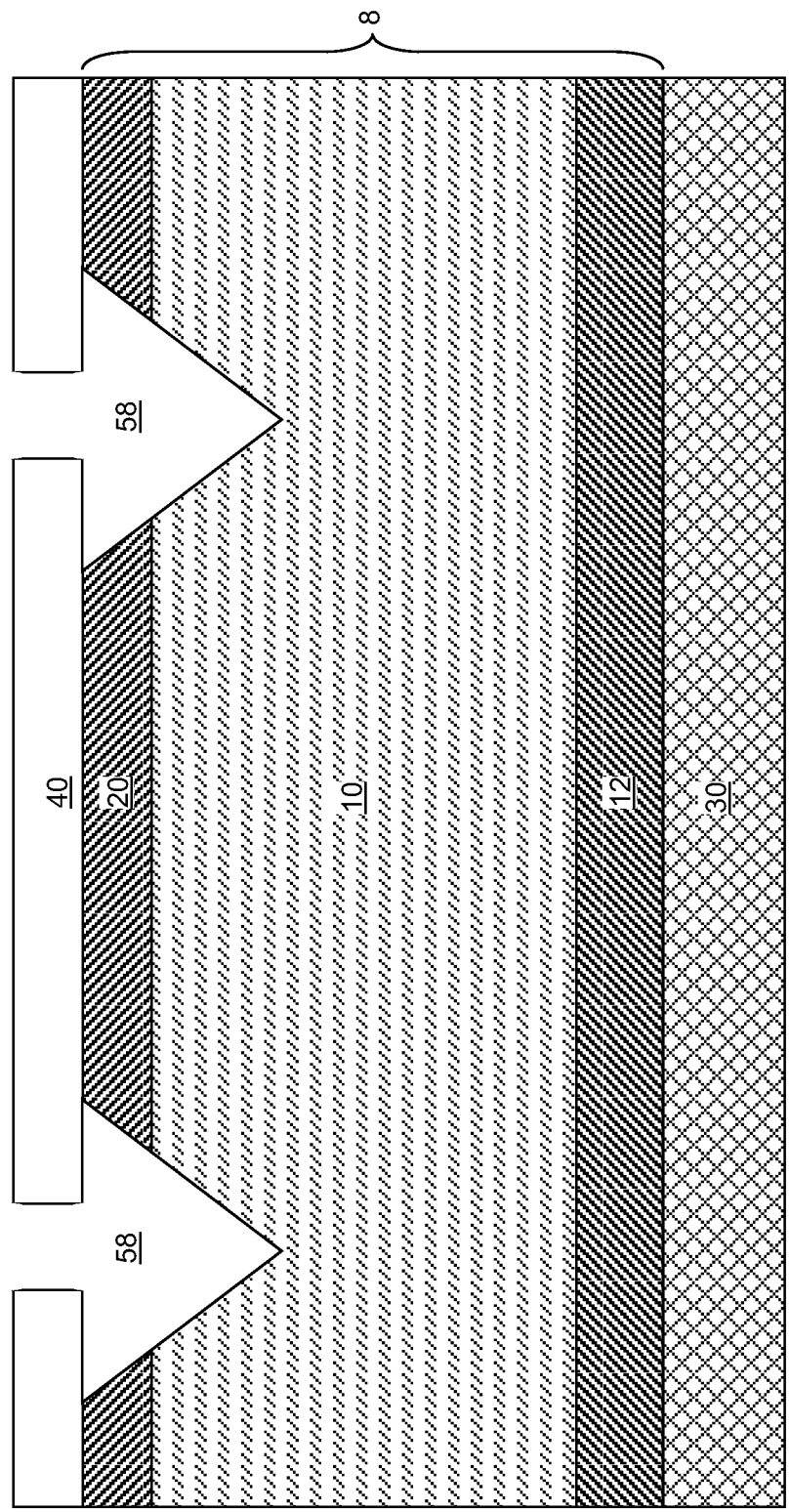
FIG. 4 is a vertical cross-sectional view of the first exemplary semiconductor structure after transferring the pattern in the dielectric material layer through a p-n junction by a wet etch according to the first embodiment of the present disclosure.

Referring to FIG. 4, the pattern in the dielectric material layer 40 is transferred into the photovoltaic substrate 8 and through the p-n junction between the first conductivity type semiconductor layer 10 and the second conductivity type semiconductor layer 20 by an etch. The residual PMMAtype-material-including layer 50 can be removed selective to the dielectric material layer 40 prior to the etch, or may be consumed during the etch.

Trenches 58 are formed in an upper portion of the photovoltaic substrate 8 in a manner that replicates the original pattern in the patterned PMMA-type-material-including layer 50 with the modification that the vertical cross-sectional profile of the trenches 58 may have a variable width due to the undercut of the dielectric material layer 40 that is introduced during the wet etch. The trenches 58 formed in the upper portion of the photovoltaic substrate 8 have semiconductor surfaces, which include surfaces of the first conductivity type semiconductor layer 10 and surfaces of the second conductivity type semiconductor layer 20.

In one embodiment, a wet etch is employed to remove surface portions of the photovoltaic substrate directly underneath the openings 59 (See FIG. 3) in the dielectric material layer 40. The wet etch employs the dielectric material layer 40 as an etch mask. The wet etch can employ any chemistry that etches the semiconductor material of the first and second conductivity type semiconductor layers (10, 20) selective to the material of the dielectric material layer 40. For example, the wet etch can employ an alkaline hydroxide solution such as NaOH or KOH.

If an alkaline hydroxide solution or any other chemical that etches a semiconductor material anisotropically, i.e., at different etch rates depending on the crystallographic orientations of exposed semiconductor surfaces, is employed and if the semiconductor material of the first conductivity type semiconductor layer 10 and/or the semiconductor material of the second conductivity type semiconductor layer 20 are single crystalline, the wet etch may produce a set of faceted crystallographic semiconductor surfaces. For example, a V-shaped groove may be formed for each trench 59. The width of each V-shaped groove can be greater than the width of the overlying opening in the dielectric material layer 40 due to the undercut that the wet etch introduces.

If the openings 59 in the dielectric material layer 40 are in the form of a line cavity, the trenches 58 can be in the form of line trenches. In one embodiment, the line trenches are parallel to one another and extend along the same horizontal direction, i.e., a horizontal direction perpendicular to the plane of the cross-section of FIG. 4.

Figure 5:
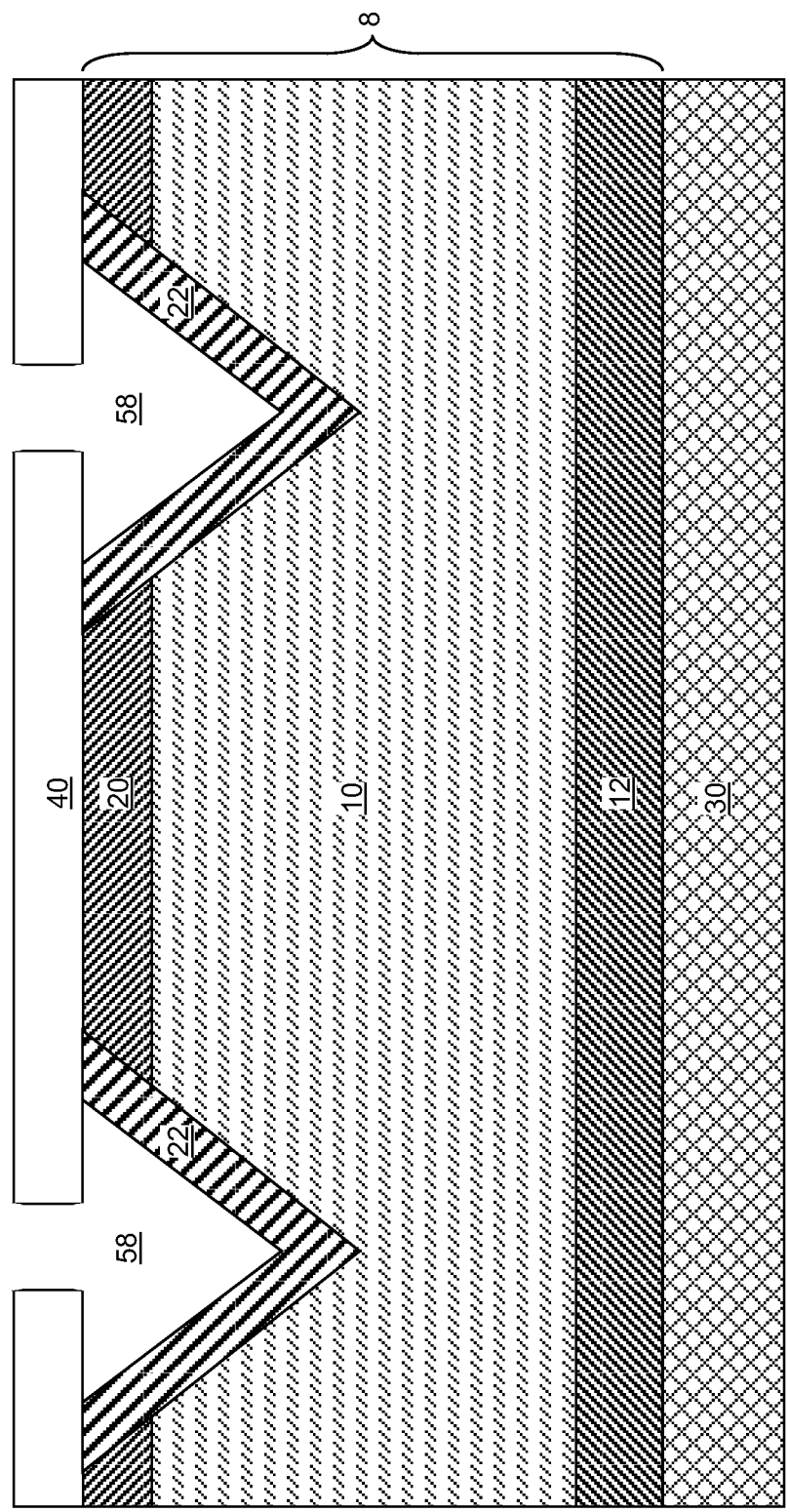
FIG. 5 is s a vertical cross-sectional view of the first exemplary semiconductor structure after doping sidewall portions of the trenches in a photovoltaic substrate according to the first embodiment of the present disclosure.

Referring to FIG. 5, sidewall portions of the trenches 58 in the photovoltaic substrate 8 are doped to form doped semiconductor portions 22. The doped semiconductor portions 22 are doped with dopants of the second conductivity type, i.e., with dopants of the same conductivity type as the dopants in the second conductivity type semiconductor layer 20, which contacts the dielectric material layer 40. Specifically, semiconductor portions of the photovoltaic substrate 8 underneath exposed surfaces of the trenches 48 are doped with dopants of the second conductivity type. The dopants can be introduced into the exposed semiconductor portions by ion implantation, gas phase doping, outdiffusion of dopants from a doped silicate glass layer (such as arsenosilicate glass, borosilicate glass, or phosphosilicate glass), or a combination thereof. The lateral extent of the doped semiconductor portions 22, as measured from a sidewall of a trench 58 to the most proximate interface between the first conductivity type semiconductor layer 10 and the doped semiconductor portion 22, can be from 0.1 micron to 5 microns, and typically from 0.2 microns to 1 microns, although lesser and greater thicknesses can also be employed.

A continuous p-n junction exists between the first conductivity type semiconductor layer 10 and the set of the second conductivity type semiconductor layer 20 and the doped semiconductor portions 22. Formation of the doped semiconductor portions 22 increases the area of the p-n junction compared with the area of the p-n junction present in the structure of FIG. 1, thereby enhancing the efficiency of the photovoltaic device.

Figure 6:
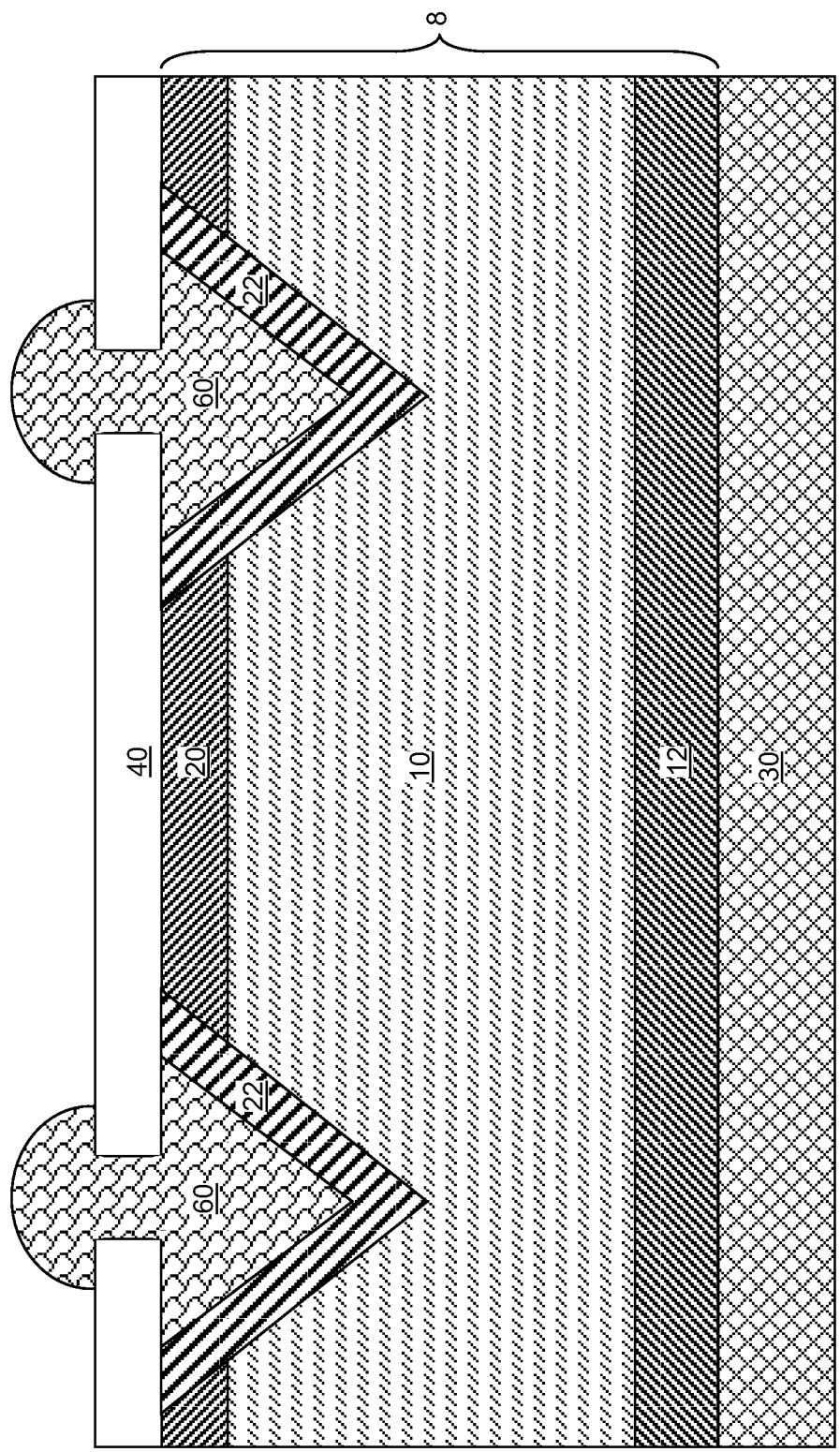
FIG. 6 is s a vertical cross-sectional view of the first exemplary semiconductor structure after forming front-side contact structures according to the first embodiment of the present disclosure.

Referring to FIG. 6, front-side contact structures 60 are formed by depositing a metallic material. In one embodiment, the front-side contact structures 60 can include a reflowable solder material that can be deposited in the trenches 58 and reflowed to fill the trenches 58. Suitable liner materials (not shown) such as TiN, TaN, or WN can be deposited in each trench 58 before depositing the solder material. Such liner materials are incorporated into the front-side contact structures 60.

If the trenches 58 are line trenches, the front-side conductive structures 60 can be conductive lines that run parallel to one another. If the trenches 58 are V-shaped grooves, the conductive lines can have a vertical cross-sectional profile in which the conductive lines include, from bottom to top, a V-shaped lower portion in which a width increases with height up to the bottom surface of the dielectric material layer 40, a middle portion located between the height of the top surface and the bottom surface of the dielectric material layer 40 and having a width that is lesser than the maximum width of the V-shaped lower portion, and an upper portion in which the conductive material forms a hemispherical shape. The front-side contact structures 60 thus fill the trenches 58. A top portion of each front-side conductive structure 60 can protrude above the top surface of the dielectric material layer 40.

Figure 7:
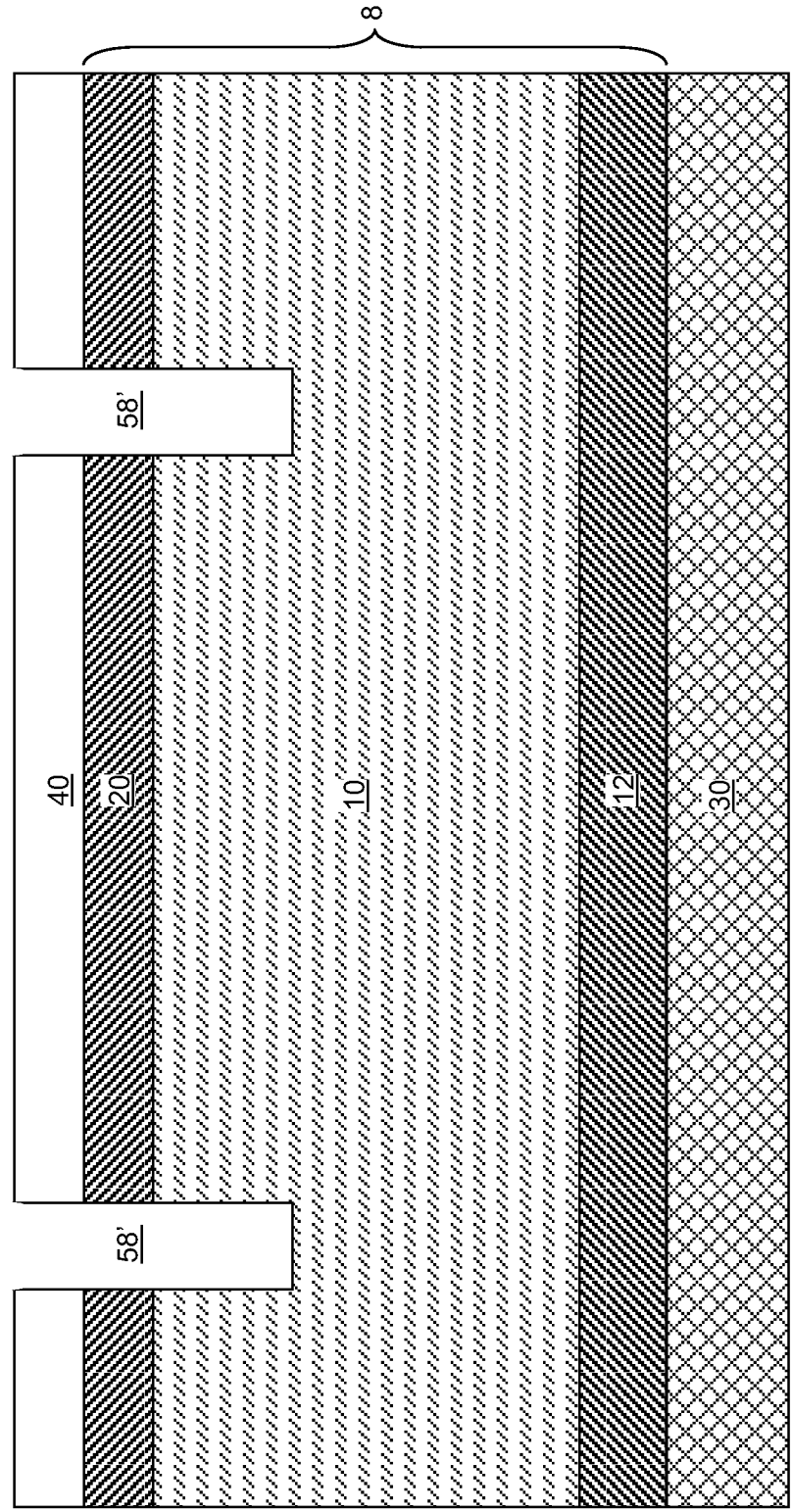
FIG. 7 is a vertical cross-sectional view of a variation of the first exemplary semiconductor structure after forming trenches in the photovoltaic substrate by an anisotropic etch according to the first embodiment.

Referring to FIG. 7, a variation of the first exemplary semiconductor structure can be derived from the first exemplary semiconductor structure of FIG. 3 by employing an anisotropic etch instead of a wet etch. The pattern in the dielectric material layer 40 is transferred into the photovoltaic substrate 8 and through the p-n junction between the first conductivity type semiconductor layer 10 and the second conductivity type semiconductor layer 20 by an anisotropic etch. Trenches 58' are formed in the upper portion of the photovoltaic substrate 8 by the anisotropic etch, which employs the dielectric material layer 40 as an etch mask. The residual PMMA-type-material-including layer 50 can be removed selective to the dielectric material layer 40 prior to the anisotropic etch, or may be consumed during the anisotropic etch.

Trenches 58' are formed in the upper portion of the photovoltaic substrate 8 in a manner that replicates the original pattern in the patterned PMMA-type-material-including layer 50. The width of the trenches 58' can be the same as the width of the openings 59 in the dielectric material layer 40. The trenches 58' formed in the upper portion of the photovoltaic substrate 8 have semiconductor surfaces, which include surfaces of the first conductivity type semiconductor layer 10 and surfaces of the second conductivity type semiconductor layer 20.

The anisotropic etch can employ any chemistry that etches the semiconductor material of the first and second conductivity type semiconductor layers (10, 20) selective to the material of the dielectric material layer 40. For example, a reactive ion etch employing hydrofluorocarbons can be employed.

If the openings 59 in the dielectric material layer 40 are in the form of a line cavity, the trenches 58' can be in the form of line trenches. In one embodiment, the line trenches are parallel to one another and extend along the same horizontal direction, i.e., a horizontal direction perpendicular to the plane of the cross-section of FIG. 7.

Figure 8:
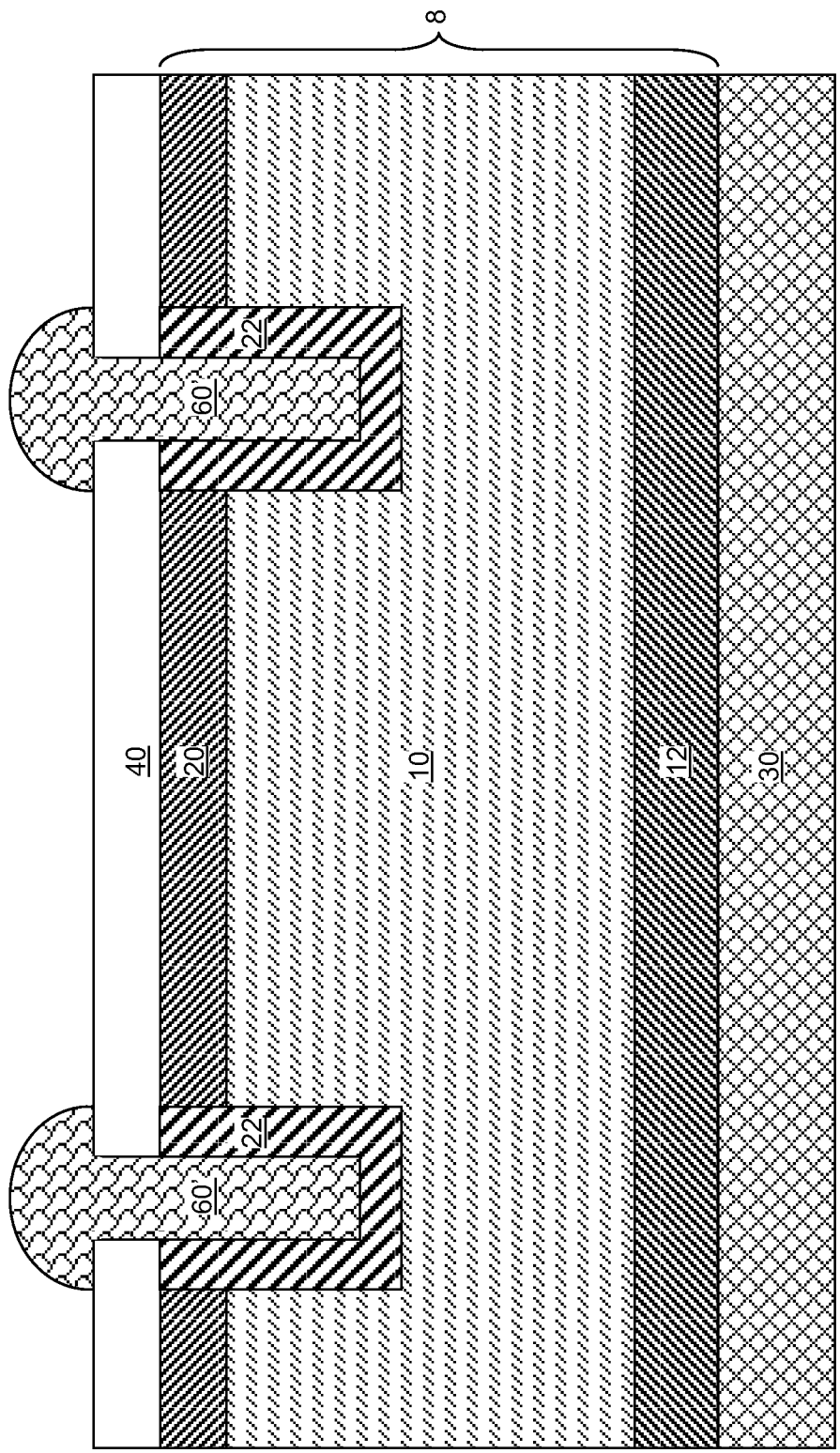
FIG. 8 is a vertical cross-sectional view of the variation of the first exemplary semiconductor structure after forming front-side contact structures according to the first embodiment.

Referring to FIG. 8, the same processing steps of FIGS. 5 and 6 can be performed to form doped semiconductor portions 22 and front-side contact structures 60'.

If the trenches 58' are line trenches, the front-side conductive structures 60' can be conductive lines that run parallel to one another. The conductive lines can have a vertical cross-sectional profile in which the conductive lines include, from bottom to top, a constant-width lower portion embedded in an upper portion of the photovoltaic substrate 8 and the dielectric material layer 40 and having a constant width, and an upper portion in which the conductive material forms a hemispherical shape. The front-side contact structures 60' thus fill the trenches 58'. A top portion of each front-side conductive structure 60' can protrude above the top surface of the dielectric material layer 40.

Figure 9:
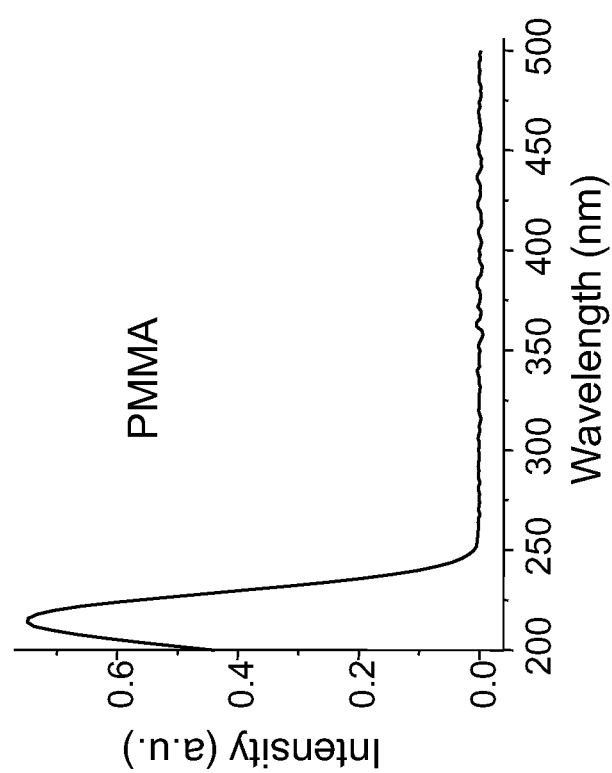
FIG. 9 is a graph of the intensity of absorbed radiation as a function of wavelength for PMMA-type-material without any dye material.

Referring to FIG. 9, the intensity of radiation absorbed in a PMMA-type-material layer consisting of PMMA-type-material is shown as a function of wavelength. The vertical axis represents the fraction of radiation absorbed in PMMA-type-material that does not include any dye in an arbitrary unit. If the blanket PMMA-type-material-including layer 50L (See FIG. 1) consists essentially of PMMA-type-material, a laser beam having a wavelength less than 250 nm is needed to ablate selected portions of the blanket PMMA-type-material-including layer 50L.

Figure 10:
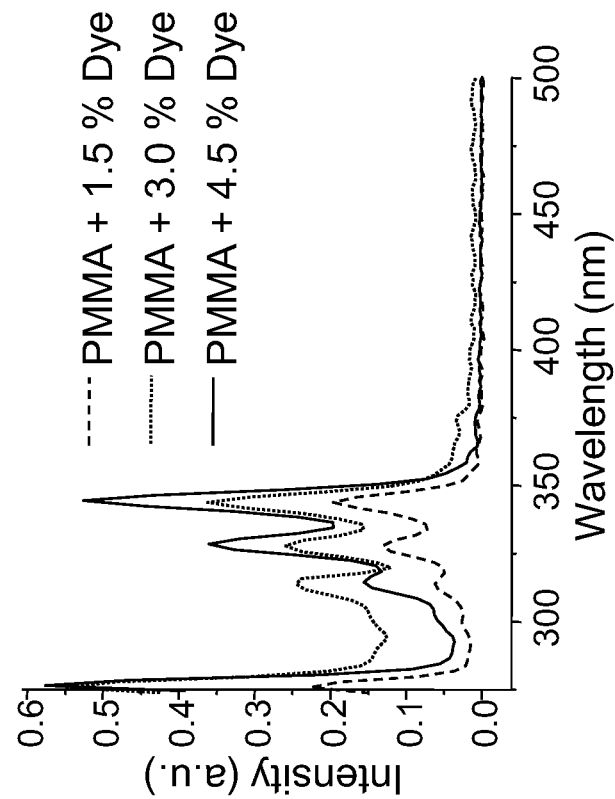
FIG. 10 is a graph of the intensity of absorbed radiation as a function of wavelength for PMMA-type-material various weight percentages of pyerenemethanol as a dye material.
Figure 11:
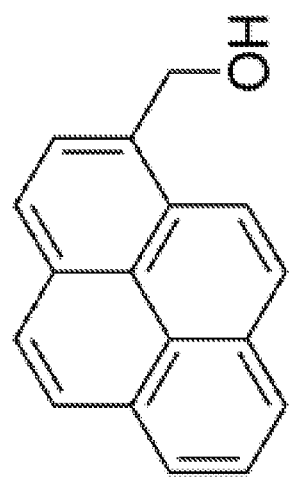
FIG. 11 illustrates a molecular structure of pyerenemethanol.

Referring to FIG. 10, the intensity of radiation absorbed in a layer including PMMA-type-material and pyerenemethanol as a dye at 1.5 weight percentage, 3.0 weight percentage, and 4.5 weight percentage, respectively, is shown as a function of wavelength. The molecular structure of pyerenemethanol is shown in FIG. 11. The vertical axis represents the fraction of radiation absorbed in the various mixtures of PMMA-type-material and pyerenemethanol as a dye in an arbitrary unit. Pyerenemethanol enhances absorption of a laser beam without significantly affecting the ablation properties of PMMA-type-material. Thus, the mixture of PMMA-type-material and pyerenemethanol can be ablated to form openings in the PMMA-type-material-including layer in the same manner as a PMMA-type-material layer. If the blanket PMMA-type-material-including layer 50L (See FIG. 1) includes a mixture of at least one PMMA-type-material and pyerenemethanol, a laser beam having a wavelength between 250 nm and 360 nm can be employed to ablate selected portions of the blanket PMMA-type-material-including layer 50L.

Figure 12:
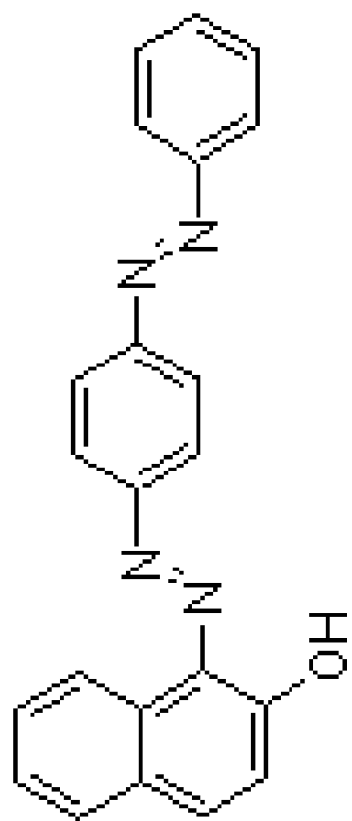
FIG. 12 illustrates a molecular structure of Sudan III.

Additional dye materials can also be employed provided that the added dye material does not significantly affect the ablation properties of the at least one PMMA-type-material. Another such material is Sudan III, of which the molecular structure is shown in FIG. 12. Sudan III is a lysochrome (fat-soluble dye) diazo dye used for staining of triglycerides in frozen sections, and some protein bound lipids and lipoproteins on paraffin sections. It has the appearance of reddish brown crystals and a maximum absorption at 507 (304) nm. If the blanket PMMA-type-material-including layer 50L (See FIG. 1) includes a mixture of PMMA-type-material and Sudan III, a laser beam having a wavelength between 450 nm and 550 nm can be employed to ablate selected portions of the blanket PMMA-type-material-including layer 50L.

In general, the dye material to be mixed with PMMA-type-material in the blanket PMMA-type-material-including layer 50L can be selected to match the wavelength of the laser beam to be used for ablating portions of the blanket PMMA-type-material-including layer. Absorption wavelength of the dye can be selected in the wavelength range from 150 nm to 1,200 nm, although lesser and greater absorption wavelengths can also be employed.

Figure 13:
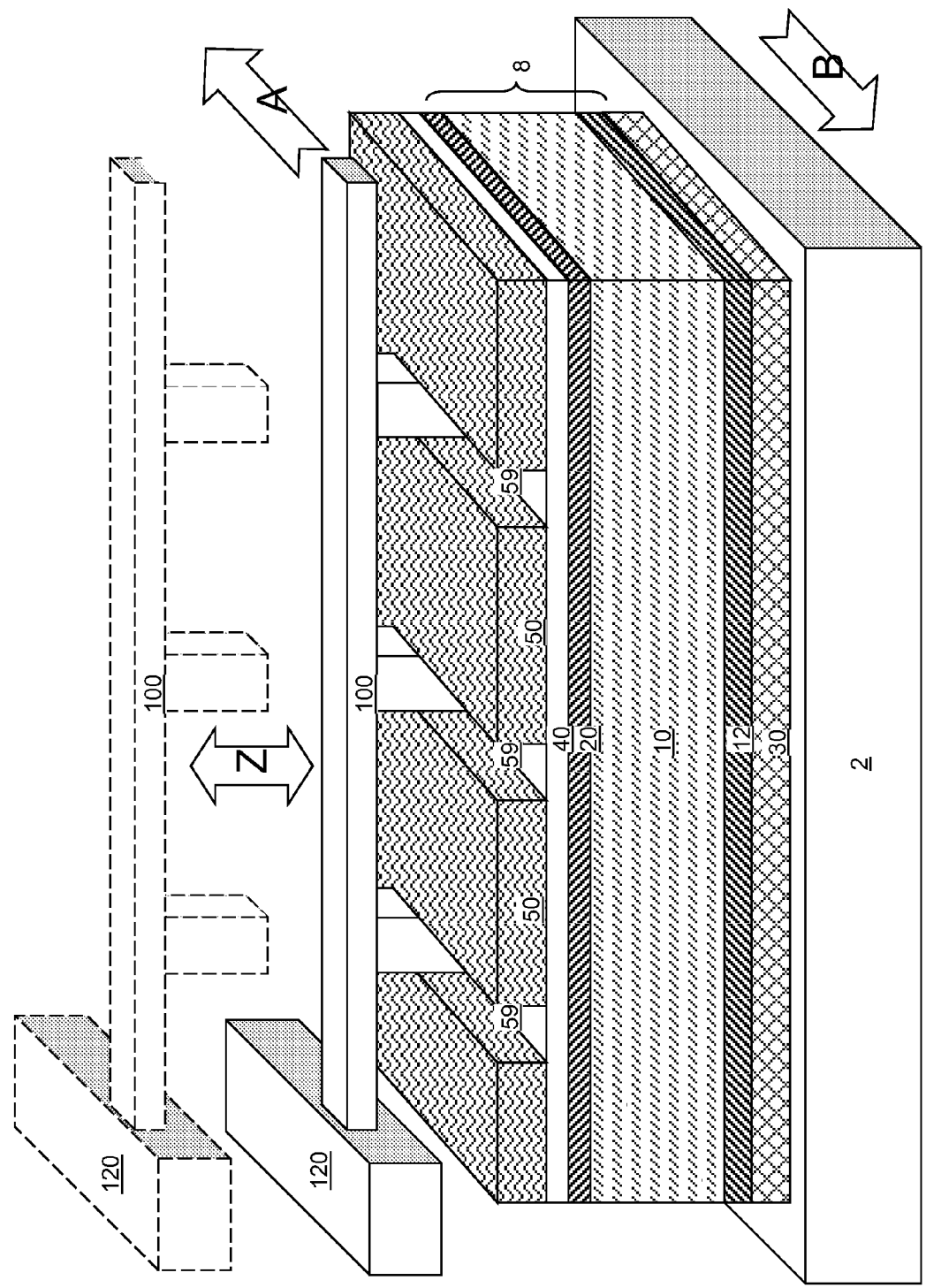
FIG. 13 illustrates a second exemplary structure including a mechanical scribing device according to a second embodiment of the present disclosure.

Referring to FIG. 13, a second exemplary structure according to a second embodiment of the present disclosure includes a mechanical scribing device 100 and the material stack of FIG. 2. The second exemplary structure can be derived by providing the first exemplary structure of FIG. 1 employing the same methods as in the first embodiment. The blanket PMMA-type-material-including layer 50L may include a dye, but a dye is in general not necessary for the second exemplary structure because laser ablation is not employed.

Mechanical scribing is employed instead of laser ablation in the second embodiment. The mechanical scribing device 100 includes a comb-like downward protruding structure having planar tips that are located on the same horizontal plane. The width of each downward protrusion in the mechanical scribing device 100 has a width, which is the target width for the openings 59 to be formed in the patterned PMMA-type-material-including layer 50.

Once a blanket PMMA-type-material-including layer is applied on the dielectric material layer 40, the downward protrusions in the mechanical scribing device 100, i.e., a plurality of protruding portions of the mechanical scribing device 100, are immersed into the blanket PMMA-type-material-including layer by a relative movement between the mechanical scribing device 100 and the first exemplary structure of FIG. 1 in the vertical direction, which is the direction represented by the arrow Z in FIG. 13. The plurality of protruding portions of the mechanical scribing device 100 may, or may not, touch the top surface of the dielectric material layer 40.

A relative horizontal movement is induced between the blanket PMMA-type-material-including layer and the plurality of protruding portions of the mechanical scribing device 100. For example, the first exemplary structure of FIG. 1 may remain stationary, and the mechanical scribing device 100 may move in one horizontal direction represented by the arrow A in FIG. 13. In this case, the lateral movement of the mechanical scribing device 100 can be provided by a scribing device actuator 120. Alternatively, the mechanical scribing device 100 may remain stationary, and the first exemplary structure of FIG. 1 may move in the opposite horizontal direction represented by the arrow B in FIG. 13. In this case, the lateral movement of the first exemplary structure can be provided by a substrate movement actuator 2 that holds and moves the first exemplary structure. In some embodiments, both a scribing device actuator 120 and a substrate movement actuator 2 can be employed.

In one embodiment, the plurality of protruding portions of the mechanical scribing device 100 contact the top surface of the dielectric material layer 40 when immersed into the blanket PMMA-type-material-including layer and while moving relative to the dielectric material layer 40. The relative movement exposes a surface of the dielectric material layer 40 underneath openings 59 within the patterned PMMA-type-material-including layer 50.

In another embodiment, the plurality of protruding portions of the mechanical scribing device 100 may not contact the top surface of the dielectric material layer 40 when immersed into the blanket PMMA-type-material-including layer and while moving relative to the dielectric material layer 40. In such an embodiment, an etch can be performed to removed a thin layer of PMMA-type-material between the bottom surfaces of the openings 59 in the patterned PMMA-type-material-including layer 50 so that a surface of the dielectric material layer 40 is exposed underneath openings 59 within the patterned PMMA-type-material-including layer 50 after the etch. The etch can be an isotropic etch or an anisotropic etch.

The processing steps of FIGS. 3-6 or the processing steps of FIGS. 3, 7, and 8 are performed in the same manner as in the first embodiment to form a structure shown in FIG. 6 or FIG. 8.

Figure 14:
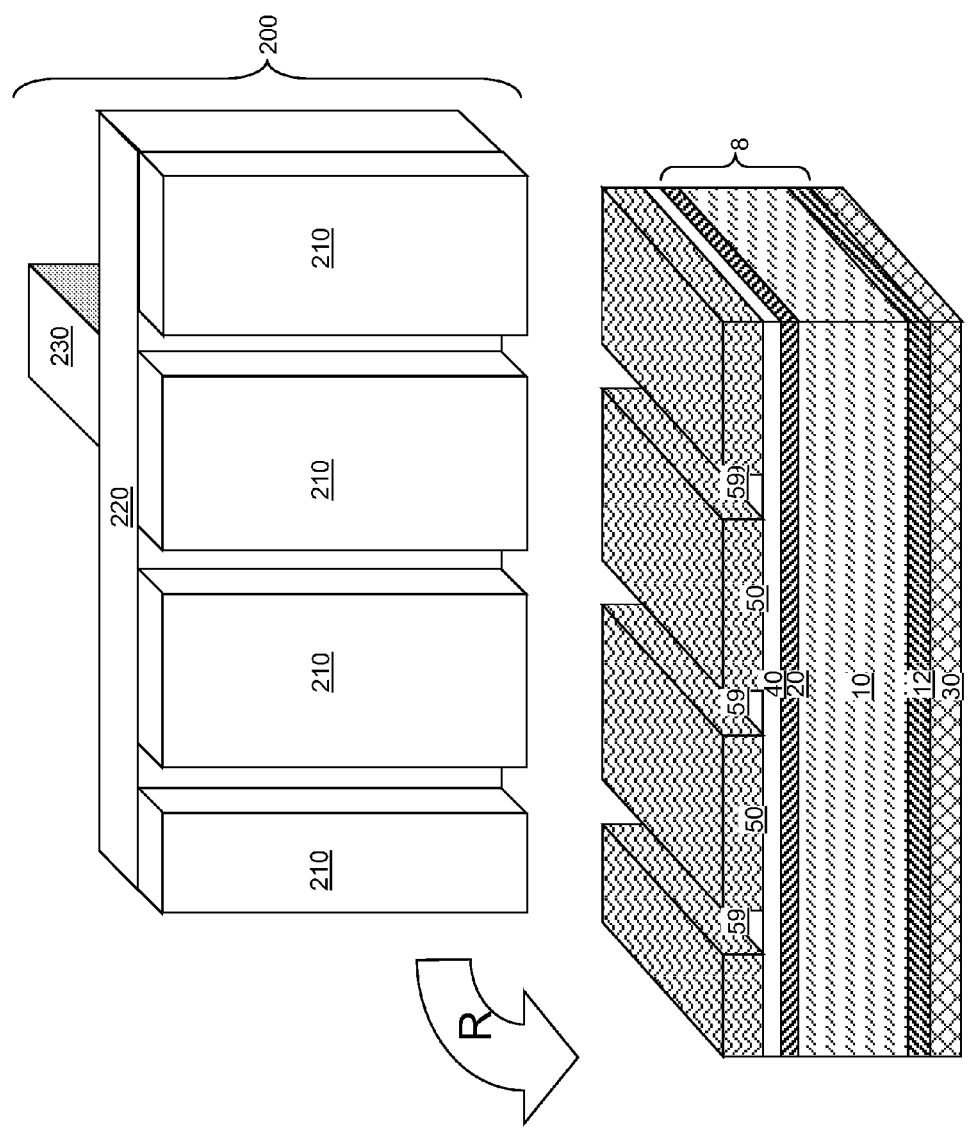
FIG. 14 illustrates a third exemplary structure including a stamping device according to a third embodiment of the present disclosure.

Referring to FIG. 14, a third exemplary structure according to a third embodiment of the present disclosure includes a stamping device 200, which is employed to form the first exemplary structure of FIG. 2. Specifically, the photovoltaic substrate 8, the conductive plate 30, and the dielectric material layer 40 are formed as described above. However, a PMMA-type-material-including layer is not applied directly to the top surface of the dielectric material layer 40 at this point.

Instead, a stamping device including a handle 230, a stamp back plate 220, and a patterned stamping pad 210 is employed. The patterned stamping pad 210 can include multiple isolated surfaces separated by channels that are parallel among one another. The width of each channel corresponds to the width of an opening 59 to be subsequently formed in a structure that is the same as the first exemplary structure of FIG. 2.

At least one PMMA-type-material is applied to the patterned surface of the stamping device 200, i.e., to the surface of the patterned stamping pad 210, for example, by immersing the surface of the patterned stamping pad 210 within the at least one PMMA-type-material. The at least one PMMA-type-material on the patterned stamping pad 210 is stamped onto the top surface of the dielectric material layer 40 employing the stamping device 200, i.e., by moving the stamping device 200 in the direction of the arrow R in FIG. 14.

The material of the patterned stamping pad 210 and the material of the dielectric material layer 40 are selected such that upon stamping, the PMMA-type-material on the surface of the patterned stamping pad 210 is transferred onto the surface of the dielectric material layer 40. Specifically, the patterned surface of the patterned stamping pad 210 has a material that has less adhesion to the PMMA-type-material than the top surface of the dielectric material layer 10. FIG. 14 illustrates the third exemplary structure after stamping, i.e., the transfer of the patterned PMMA-type-material-including layer 50 onto the top surface of the dielectric material layer 40.

In general, the patterned PMMA-type-material-including layer 50 can be formed by screen printing or ink jet printing.

The processing steps of FIGS. 3-6 or the processing steps of FIGS. 3, 7, and 8 are performed in the same manner as in the first embodiment to form a structure shown in FIG. 6 or FIG. 8.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming contact structures on a photovoltaic substrate comprising:
    forming a dielectric material layer on a photovoltaic substrate including a p-n junction at an interface between a first conductivity type semiconductor layer and a second conductivity type semiconductor layer;
    forming a patterned PMMA-type-material-including layer on said dielectric material layer;
    transferring a pattern in said patterned PMMA-type-material-including layer through said dielectric material layer and into an upper portion of said photovoltaic substrate and through said p-n junction by etching, wherein trenches having semiconductor surfaces are formed in said upper portion of said photovoltaic substrate; and
    forming contact structures comprising a conductive material directly in contact with said semiconductor surfaces of said trenches.

2. The method of claim 1, wherein said patterned PMMA-type-material-including layer is formed by:
    applying a blanket PMMA-type-material-including layer on said dielectric material layer; and
    ablating portions of said blanket PMMA-type-material-including layer with a laser beam, wherein remaining portions of said blanket PMMA-type-material-including layer after said ablation is said patterned PMMA-type-material-including layer.

3. The method of claim 2, wherein said blanket PMMA-type-material-including layer includes a dye that enhances absorption of said laser beam.

4. The method of claim 3, wherein said dye is pyerenemethanol.

5. The method of claim 3, wherein said dye is Sudan III.

6. The method of claim 3, wherein said dye is present at a weight percentage between 0.1% to 10% within said blanket PMMA-type-material-including layer.

7. The method of claim 2, wherein said laser beam has a wavelength from 150 nm to 1,200 nm.

8. The method of claim 2, wherein said ablating exposes a surface of said dielectric material layer underneath an opening within said patterned PMMA-type-material-including layer.

9. The method of claim 2, wherein said ablating forms multiple openings in said patterned PMMA-type-material-including layer, and said multiple openings isolate said patterned PMMA-type-material-including layer into multiple PMMA-type-material-including portions that do not contact one another.

10. The method of claim 1, wherein said patterned PMMA-type-material-including layer is formed by:
    applying a blanket PMMA-type-material-including layer on said dielectric material layer;
    immersing a plurality of protruding portions of a mechanical scribing device into said blanket PMMA-type-material-including layer; and
    inducing a relative movement between said blanket PMMA-type-material-including layer and said plurality of protruding portions.

11. The method of claim 1, wherein said patterned PMMA-type-material-including layer is formed by:
    applying PMMA-type-material to a patterned surface of a stamping device; and
    stamping said PMMA-type-material onto a top surface of said dielectric material layer employing said stamping device.

12. The method of claim 11, wherein said patterned surface has a material that has less adhesion to said PMMA-type-material than said top surface of said dielectric material layer.

13. The method of claim 11, wherein said patterned surface includes multiple isolated surfaces separated by channels that are parallel among one another.

14. The method of claim 1, wherein said dielectric material layer includes a dielectric material selected from silicon dioxide, silicon nitride, silicon oxynitride, aluminum oxide, and combinations thereof.

15. The method of claim 1, wherein said photovoltaic substrate includes a p-n junction at an interface between a p-doped semiconductor material layer and an n-doped semiconductor material layer, and said trenches are formed through said p-n junction.

16. The method of claim 15, further comprising doping semiconductor portions of said photovoltaic substrate underneath exposed surfaces of said trenches with dopants that have a same conductivity type as a portion of said photovoltaic substrate that contacts said dielectric material layer.

17. The method of claim 16, wherein said dopants are introduced into said semiconductor portions by ion implantation, gas phase doping, outdiffusion of dopants from a doped silicate glass layer, or a combination thereof.

18. The method of claim 1, wherein said trenches are formed by an anisotropic etch employing said dielectric material layer as an etch mask.

19. The method of claim 1, wherein said trenches are formed by a wet etch employing said dielectric material layer as an etch mask.

20. The method of claim 19, wherein said etch is a buffered oxide etch employing an alkaline hydroxide solution.

21. The method of claim 1, further comprising forming a conductive plate on a surface of said photovoltaic substrate located on an opposite side of said dielectric material layer.

22. The method of claim 1, wherein said trenches are line trenches that extend along a same horizontal direction.

23. The method of claim 22, wherein said contact structures are conductive metal lines having a top portion that protrude above a top surface of said dielectric material layer.

24. The method of claim 1, further comprising forming doped semiconductor portions having a doping of said second conductivity directly underneath an entirety of said semiconductor surfaces within said trenches prior to forming said contact structures.

25. The method of claim 24, wherein a continuous p-n junction including portions of said p-n junction and interfaces between said doped semiconductor portions and said first conductivity semiconductor layer are formed within said substrate upon formation of said doped semiconductor portions.

* * * * *